United States Patent
Chu et al.

(10) Patent No.: US 9,954,136 B2
(45) Date of Patent: Apr. 24, 2018

(54) CASSETTE OPTIMIZED FOR AN INLINE ANNEALING SYSTEM

(71) Applicant: SolarCity Corporation, San Mateo, CA (US)

(72) Inventors: Xinsheng Chu, Santa Clara, CA (US); Ming-Du Kang, Milpitas, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 15/227,728

(22) Filed: Aug. 3, 2016

(65) Prior Publication Data
US 2018/0040761 A1    Feb. 8, 2018

(51) Int. Cl.
*H01L 31/18* (2006.01)
*H01L 21/677* (2006.01)

(52) U.S. Cl.
CPC ...... *H01L 31/1876* (2013.01); *H01L 31/1864* (2013.01); *H01L 21/6773* (2013.01)

(58) Field of Classification Search
CPC .................. H01L 31/1864; H01L 31/1876
See application file for complete search history.

(56) References Cited

U.S. PATENT DOCUMENTS

| | | |
|---|---|---|
| 3,603,284 A | 9/1971 | Garnache |
| 3,637,434 A | 1/1972 | Nakanuma |
| 3,658,585 A | 4/1972 | Folkmann |
| 3,675,619 A | 7/1972 | Burd |
| 3,699,298 A | 10/1972 | Briody |
| 3,796,182 A | 3/1974 | Rosler |
| 3,806,360 A | 4/1974 | Briody |
| 4,154,998 A | 5/1979 | Luft |
| 4,168,998 A | 9/1979 | Hasegawa |
| 4,193,756 A | 3/1980 | Leon |
| 4,268,374 A | 5/1981 | Lepselter |
| 4,298,443 A | 11/1981 | Maydan |
| 4,325,778 A | 4/1982 | Lepselter |
| 4,355,974 A * | 10/1982 | Lee ............... C30B 31/103 118/500 |
| 4,496,828 A | 1/1985 | Kusmierz |

(Continued)

FOREIGN PATENT DOCUMENTS

| | | |
|---|---|---|
| CN | 104600158 | 5/2001 |
| CN | 101263590 | 9/2008 |

(Continued)

OTHER PUBLICATIONS

JP11163089A—machine translation.*

(Continued)

*Primary Examiner* — Nathaniel Herzfeld
(74) *Attorney, Agent, or Firm* — Shun Yao; Park, Vaughan, Fleming & Dowler LLP

(57) ABSTRACT

An apparatus for carrying a plurality of photovoltaic structures is provided. The apparatus can include a pair of end plates, a set of stationary posts coupling together the end plates, and a wafer-locking mechanism that can be engaged when the apparatus changes orientation. At least one stationary post can be shaped like a comb and have a first array of comb teeth for separating the photovoltaic structures. The wafer-locking mechanism can be configured to lock the photovoltaic structures in position, thereby preventing motion-induced damage to the photovoltaic structures.

18 Claims, 13 Drawing Sheets

(56) References Cited

U.S. PATENT DOCUMENTS

| | | | |
|---|---|---|---|
| 4,522,149 | A | 6/1985 | Garbis |
| 4,558,660 | A | 12/1985 | Nishizawa |
| 4,565,157 | A | 1/1986 | Brors |
| 4,579,080 | A | 4/1986 | Martin |
| 4,612,207 | A | 9/1986 | Jansen |
| 4,661,199 | A | 4/1987 | Looney |
| 4,668,484 | A | 5/1987 | Elliott |
| 4,747,367 | A | 5/1988 | Posa |
| 4,761,044 | A | 8/1988 | Akama |
| 4,761,269 | A | 8/1988 | Conger |
| 4,786,352 | A | 11/1988 | Benzing |
| 4,794,220 | A | 12/1988 | Sekiya |
| 4,807,562 | A | 2/1989 | Sandys |
| 4,823,736 | A | 4/1989 | Post |
| 4,838,983 | A | 6/1989 | Schumaker |
| 4,839,145 | A | 6/1989 | Gale |
| 4,858,558 | A | 8/1989 | Ohmura |
| 4,867,629 | A | 9/1989 | Iwasawa |
| 4,928,626 | A | 5/1990 | Carlson |
| 4,967,645 | A | 11/1990 | Mattson |
| 4,993,559 | A * | 2/1991 | Cota ............... H01L 21/67313 211/41.18 |
| 5,038,711 | A | 8/1991 | Dan |
| 5,053,247 | A | 10/1991 | Moore |
| 5,067,218 | A | 11/1991 | Williams |
| 5,074,245 | A | 12/1991 | Ota |
| 5,119,540 | A | 6/1992 | Kong |
| 5,121,531 | A | 6/1992 | Severns |
| 5,151,133 | A | 9/1992 | Ohmine |
| 5,207,835 | A | 5/1993 | Moore |
| 5,269,847 | A | 12/1993 | Anderson |
| 5,288,364 | A | 2/1994 | Burt |
| 5,350,455 | A | 9/1994 | Mahler |
| 5,351,415 | A | 10/1994 | Brooks |
| 5,373,806 | A | 12/1994 | Logar |
| 5,374,159 | A | 12/1994 | Severns |
| 5,427,824 | A | 6/1995 | Inushima |
| 5,441,571 | A | 8/1995 | Ohta |
| 5,452,795 | A * | 9/1995 | Gallagher ......... H01L 21/67369 206/454 |
| 5,453,124 | A | 9/1995 | Moslehi |
| 5,458,918 | A | 10/1995 | Hawkins |
| 5,476,359 | A | 12/1995 | Severns |
| 5,505,778 | A | 4/1996 | Ono |
| 5,518,549 | A | 5/1996 | Hellwig |
| 5,532,190 | A | 7/1996 | Goodyear |
| 5,614,447 | A | 3/1997 | Yamaga |
| 5,629,245 | A | 5/1997 | Inushima |
| 5,700,422 | A | 12/1997 | Usui |
| 5,785,186 | A * | 7/1998 | Babbs ............... H01L 21/67294 206/454 |
| H1762 | H | 12/1998 | Kaempf |
| H001762 | H * | 12/1998 | Kaempf ............. H01L 21/67369 206/710 |
| 5,871,586 | A | 2/1999 | Crawley |
| 5,916,369 | A | 6/1999 | Anderson |
| 5,950,925 | A | 9/1999 | Fukunaga |
| 5,960,960 | A * | 10/1999 | Yamamoto ........ H01L 21/67326 206/454 |
| 5,964,948 | A | 10/1999 | Dietze |
| 5,993,555 | A | 11/1999 | Hamilton |
| 5,994,675 | A | 11/1999 | Bethune |
| 6,013,338 | A | 1/2000 | Inushima |
| 6,077,722 | A | 6/2000 | Jansen |
| 6,098,808 | A | 8/2000 | Matsuda |
| 6,110,289 | A | 8/2000 | Moore |
| 6,113,984 | A | 9/2000 | MacLeish |
| 6,120,605 | A | 9/2000 | Sato |
| 6,122,566 | A | 9/2000 | Nguyen |
| 6,129,048 | A | 10/2000 | Sullivan |
| 6,152,680 | A * | 11/2000 | Howells ............. H01L 21/6732 414/781 |
| 6,193,804 | B1 | 2/2001 | Chang |
| 6,214,116 | B1 | 4/2001 | Shin |
| 6,217,662 | B1 | 4/2001 | Kong |
| 6,262,393 | B1 | 7/2001 | Imai |
| 6,328,169 | B1 | 12/2001 | Matsuda |
| 6,338,756 | B2 | 1/2002 | Dietze |
| 6,348,397 | B2 | 2/2002 | Ide |
| 6,370,791 | B1 * | 4/2002 | Weaver ............. H01L 21/67313 34/109 |
| 6,399,510 | B1 | 6/2002 | Riley |
| 6,435,428 | B2 | 8/2002 | Kim |
| 6,472,284 | B2 | 10/2002 | Kim |
| 6,472,639 | B2 | 10/2002 | Nishitani |
| 6,478,923 | B1 | 11/2002 | Igarashi |
| 6,500,734 | B2 | 12/2002 | Anderson |
| 6,506,256 | B2 | 1/2003 | Ide |
| 6,530,990 | B2 | 3/2003 | Kong |
| 6,544,333 | B2 | 4/2003 | Keck |
| 6,562,128 | B1 | 5/2003 | Dietze |
| 6,586,270 | B2 | 7/2003 | Tsuzuki et al. |
| 6,637,988 | B1 | 10/2003 | Park |
| 6,679,672 | B1 | 1/2004 | Barrows |
| 6,716,027 | B2 | 4/2004 | Kim |
| 6,747,249 | B2 | 6/2004 | Robinson |
| 6,808,352 | B2 | 10/2004 | Seita |
| 6,814,811 | B2 | 11/2004 | Ose |
| 6,916,399 | B1 | 7/2005 | Rozenzon |
| 6,923,325 | B2 * | 8/2005 | Duban-Hu ........ H01L 21/67383 206/454 |
| 6,934,145 | B2 | 8/2005 | Hsieh |
| 6,948,623 | B2 | 9/2005 | Takano |
| 6,959,823 | B2 * | 11/2005 | Jun ..................... B65D 25/103 211/41.18 |
| 7,153,368 | B2 | 12/2006 | Preti |
| 7,159,537 | B2 | 1/2007 | Wickramanayaka |
| 7,225,934 | B2 * | 6/2007 | Shon ................. H01L 21/6734 211/41.18 |
| 7,270,713 | B2 | 9/2007 | Blonigan |
| 7,273,526 | B2 | 9/2007 | Shinriki |
| 7,293,950 | B2 | 11/2007 | Bonora |
| 7,313,452 | B2 | 12/2007 | Kobayashi |
| 7,314,526 | B1 | 1/2008 | Preti |
| 7,354,622 | B2 | 4/2008 | Shinriki |
| 7,357,842 | B2 | 4/2008 | Ishikawa |
| 7,410,340 | B2 | 8/2008 | Bonora |
| 7,442,562 | B2 | 10/2008 | Onishi |
| 7,462,246 | B2 | 12/2008 | Hellwig |
| 7,628,863 | B2 | 12/2009 | Sen |
| 7,819,261 | B2 | 10/2010 | Mayuzumi |
| 7,897,525 | B2 | 3/2011 | Lei |
| 7,900,776 | B2 * | 3/2011 | Burns .................. B65D 51/26 206/711 |
| 7,918,938 | B2 | 4/2011 | Provencher |
| 7,988,399 | B2 | 8/2011 | vanderMeulen |
| 7,989,729 | B1 | 8/2011 | Zhao |
| 8,034,667 | B2 | 10/2011 | Shinoda |
| 8,080,107 | B2 | 12/2011 | Kennedy |
| 8,110,511 | B2 | 2/2012 | Lei |
| 8,133,323 | B2 | 3/2012 | Kakegawa |
| 8,173,473 | B2 | 5/2012 | Aqui |
| 8,183,132 | B2 | 5/2012 | Nijhawan |
| 8,231,799 | B2 | 7/2012 | Bera |
| 8,246,284 | B2 | 8/2012 | Borden |
| 8,257,547 | B2 | 9/2012 | Pei |
| 8,268,078 | B2 | 9/2012 | Suzuki |
| 8,268,734 | B2 | 9/2012 | Lei |
| 8,288,645 | B2 | 10/2012 | Lee |
| 8,367,565 | B2 | 2/2013 | Lei |
| 8,388,753 | B2 | 3/2013 | Pei |
| 8,404,049 | B2 | 3/2013 | Hellwig |
| 8,430,962 | B2 | 4/2013 | Masuda |
| 8,435,424 | B2 | 5/2013 | Hsu |
| 8,448,598 | B2 | 5/2013 | Pei |
| 8,481,844 | B2 | 7/2013 | Nishida |
| 8,500,388 | B2 | 8/2013 | vanderMeulen |
| 8,528,750 | B2 | 9/2013 | Heo |
| 8,539,908 | B2 | 9/2013 | Takagi |
| 8,562,745 | B2 | 10/2013 | Rozenzon |
| 8,563,998 | B2 | 10/2013 | Wegleiter |
| 8,608,854 | B2 | 12/2013 | Pei |
| 8,686,283 | B2 | 4/2014 | Heng |

(56) References Cited

U.S. PATENT DOCUMENTS

| | | |
|---|---|---|
| 8,691,620 B2 | 4/2014 | Lee |
| 8,764,902 B2 | 7/2014 | Suzuki |
| 8,778,079 B2 | 7/2014 | Begarney |
| 8,808,454 B2 | 8/2014 | Lee |
| 8,877,000 B2 | 11/2014 | Strang |
| 8,898,930 B2 | 12/2014 | Godot |
| 8,967,081 B2 | 3/2015 | Borean |
| 8,980,005 B2 | 3/2015 | Carlson |
| 9,022,714 B2 | 5/2015 | Lee |
| 9,105,673 B2 | 8/2015 | Babbs |
| 9,117,670 B2 | 8/2015 | Abedijaberi |
| 9,147,788 B2 | 9/2015 | DeGroot |
| 9,159,864 B2 | 10/2015 | Lucas |
| 9,205,505 B2 | 12/2015 | Sridharan |
| 2001/0040100 A1 | 11/2001 | Wang |
| 2002/0004309 A1 | 1/2002 | Collins |
| 2002/0102859 A1 | 8/2002 | Yoo |
| 2003/0012885 A1 | 1/2003 | Gramarossa |
| 2003/0019428 A1 | 1/2003 | Ku |
| 2003/0145791 A1 | 8/2003 | Shinya |
| 2004/0135979 A1 | 7/2004 | Hazelton |
| 2005/0016956 A1 | 1/2005 | Liu |
| 2005/0105991 A1 | 5/2005 | Hofmeister |
| 2005/0199279 A1 | 9/2005 | Yoshimine et al. |
| 2005/0208217 A1 | 9/2005 | Shinriki |
| 2005/0226794 A1 | 10/2005 | Hodge |
| 2005/0229848 A1 | 10/2005 | Shinriki |
| 2006/0006559 A1 | 1/2006 | Nakagawa |
| 2006/0016559 A1 | 1/2006 | Kobayashi |
| 2006/0060791 A1 | 3/2006 | Hazelton |
| 2006/0124169 A1 | 6/2006 | Mizusawa |
| 2006/0156970 A1 | 7/2006 | Dong-Suk |
| 2006/0191118 A1 | 8/2006 | Lee |
| 2006/0191637 A1 | 8/2006 | Zajac |
| 2006/0201414 A1 | 9/2006 | Brabant |
| 2006/0231035 A1 | 10/2006 | Hellwig |
| 2006/0292846 A1 | 12/2006 | Pinto |
| 2007/0011863 A1 | 1/2007 | Yoshikawa |
| 2007/0051314 A1 | 3/2007 | Choi |
| 2007/0131173 A1 | 6/2007 | Halpin |
| 2007/0175391 A1 | 8/2007 | Mizusawa |
| 2007/0181181 A1 | 8/2007 | Mizusawa |
| 2007/0247075 A1 | 10/2007 | Kim |
| 2007/0249173 A1 | 10/2007 | Kim |
| 2007/0251642 A1 | 11/2007 | Bera |
| 2007/0254483 A1 | 11/2007 | Bera |
| 2007/0254486 A1 | 11/2007 | Bera |
| 2008/0000851 A1 | 1/2008 | Pickering |
| 2008/0092944 A1 | 4/2008 | Rubin |
| 2008/0176289 A1 | 7/2008 | Zeng |
| 2008/0196757 A1 | 8/2008 | Yoshimine |
| 2008/0276451 A1 | 11/2008 | Morad |
| 2009/0014746 A1 | 1/2009 | Gweneth |
| 2009/0067957 A1 | 3/2009 | Ando |
| 2009/0081878 A1 | 3/2009 | Dhindsa |
| 2009/0117746 A1 | 5/2009 | Masuda |
| 2009/0139570 A1 | 6/2009 | Kinoshita |
| 2009/0194235 A1 | 8/2009 | Kobayashi |
| 2009/0311869 A1 | 12/2009 | Okesaku |
| 2010/0009489 A1 | 1/2010 | Tu |
| 2010/0029067 A1 | 2/2010 | Vijh |
| 2010/0047954 A1 | 2/2010 | Su |
| 2010/0092697 A1 | 4/2010 | Poppe |
| 2010/0092698 A1 | 4/2010 | Poppe |
| 2010/0096003 A1 | 4/2010 | Hobbie |
| 2010/0132778 A1 | 6/2010 | Hong |
| 2010/0162954 A1 | 7/2010 | Lei |
| 2010/0167503 A1 | 7/2010 | Lei |
| 2010/0171215 A1 | 7/2010 | Fischer |
| 2010/0173439 A1 | 7/2010 | Lei |
| 2010/0183825 A1 | 7/2010 | Becker |
| 2010/0263587 A1 | 10/2010 | Sivaramakrishnan |
| 2010/0273279 A1 | 10/2010 | Su |
| 2010/0282272 A1 | 11/2010 | Godot |
| 2010/0300506 A1 | 12/2010 | Heng et al. |
| 2010/0313877 A1 | 12/2010 | Bellman |
| 2011/0033638 A1 | 2/2011 | Ponnekanti |
| 2011/0033957 A1 | 2/2011 | Holden |
| 2011/0048325 A1 | 3/2011 | Choi |
| 2011/0067632 A1 | 3/2011 | Poppe |
| 2011/0140246 A1 | 6/2011 | Hoenk |
| 2011/0151119 A1 | 6/2011 | Lei |
| 2011/0177627 A1 | 7/2011 | Huegli |
| 2011/0217469 A1 | 9/2011 | Lei |
| 2011/0245957 A1 | 10/2011 | Porthouse |
| 2011/0262252 A1 | 10/2011 | Lee |
| 2011/0262628 A1 | 10/2011 | Sferlazzo |
| 2011/0263070 A1 | 10/2011 | Schaeffer |
| 2011/0277688 A1 | 11/2011 | Trujillo |
| 2011/0277690 A1 | 11/2011 | Rozenzon |
| 2011/0283941 A1 | 11/2011 | Rozenzon |
| 2011/0285840 A1 | 11/2011 | Benson |
| 2012/0076936 A1 | 3/2012 | Hirano |
| 2012/0111271 A1 | 5/2012 | Begarney |
| 2012/0125391 A1 | 5/2012 | Pinarbasi |
| 2012/0315395 A1 | 12/2012 | Kuribe |
| 2012/0318340 A1 | 12/2012 | Borden |
| 2013/0171757 A1 | 7/2013 | Ponnekanti |
| 2013/0269602 A1 | 10/2013 | Miyamoto |
| 2014/0060633 A1 | 3/2014 | Lucas |
| 2014/0086720 A1 | 3/2014 | Kao |
| 2014/0124013 A1 | 5/2014 | Morad et al. |
| 2014/0124713 A1 | 5/2014 | Majumdar |
| 2014/0213016 A1 | 7/2014 | Sheng |
| 2014/0287159 A1 | 9/2014 | Carmody |
| 2014/0299256 A1 | 10/2014 | Sridharan |
| 2015/0068587 A1 | 3/2015 | Lomasney |
| 2015/0108107 A1 | 4/2015 | Liu |
| 2015/0194374 A1 | 7/2015 | Ananiev |
| 2015/0206780 A1 | 7/2015 | Choi |
| 2015/0303079 A1 | 10/2015 | Oosterlaken |
| 2015/0349703 A1 | 12/2015 | Morad |
| 2015/0364356 A1 | 12/2015 | Moore |
| 2016/0009958 A1 | 1/2016 | Moore |

FOREIGN PATENT DOCUMENTS

| | | | |
|---|---|---|---|
| CN | 102559134 | | 7/2012 |
| CN | 102800746 | | 11/2012 |
| CN | 103943727 | | 7/2014 |
| CN | 104040732 | | 9/2014 |
| CN | 103000253 | | 5/2015 |
| CN | 105761778 | | 7/2016 |
| DE | 3833703 | | 5/1992 |
| EP | 2098609 | | 9/2009 |
| EP | 2489759 | | 8/2012 |
| JP | H071222622 | | 5/1995 |
| JP | 07230942 | | 8/1995 |
| JP | H07230942 | | 8/1995 |
| JP | 11163089 | | 6/1999 |
| JP | 11163089 | A * | 6/1999 |
| JP | H11288890 | A | 10/1999 |
| JP | 200068356 | | 3/2000 |
| JP | 2000068356 | | 3/2000 |
| JP | 2001284218 | | 10/2001 |
| JP | 2002179207 | | 6/2002 |
| JP | 2003158054 | A | 5/2003 |
| JP | 2003277936 | A | 10/2003 |
| JP | 2004296855 | | 10/2004 |
| JP | 2006080098 | A | 3/2006 |
| JP | 2007207762 | | 8/2007 |
| JP | 2013033967 | | 2/2013 |
| JP | 2013149596 | | 8/2013 |
| JP | 2014007309 | | 1/2014 |
| JP | 2014197592 | | 10/2014 |
| KR | 20060117134 | A | 11/2006 |
| KR | 1404986 | | 6/2014 |
| KR | 20150137810 | | 12/2015 |
| WO | 2011133965 | | 10/1920 |
| WO | 0072362 | | 11/2000 |
| WO | 2009029901 | | 3/2009 |
| WO | 2009090172 | | 7/2009 |
| WO | 2010129136 A2 | | 11/2010 |
| WO | 2010129136 A3 | | 11/2010 |

(56) References Cited

FOREIGN PATENT DOCUMENTS

| WO | 2012128459 | 9/2012 |
| WO | 2012174432 | 12/2012 |
| WO | 2013124394 | 8/2013 |
| WO | 2014038277 | 3/2014 |
| WO | 2014045241 | 3/2014 |
| WO | 2014046810 | 3/2014 |
| WO | 2015163163 | 10/2015 |

OTHER PUBLICATIONS

Beaucarne, G et al., "Epitaxial thin-film Si solar cells", pp. 533-542, Science Direct, www.sciencedirect.com, Thin Solid 511-512 (2006) 533-542.

Cebrian et al., "Paste Adhesive Modification for Induction Curing", Jan. 2012.

"Pad printing as a film forming technique for polymer solar cells" Krebs, F.C.

"Thick-Film Materials for Silicon Photovoltaic Cell Manufacture" Field, M.B. Jan. 1997.

\* cited by examiner

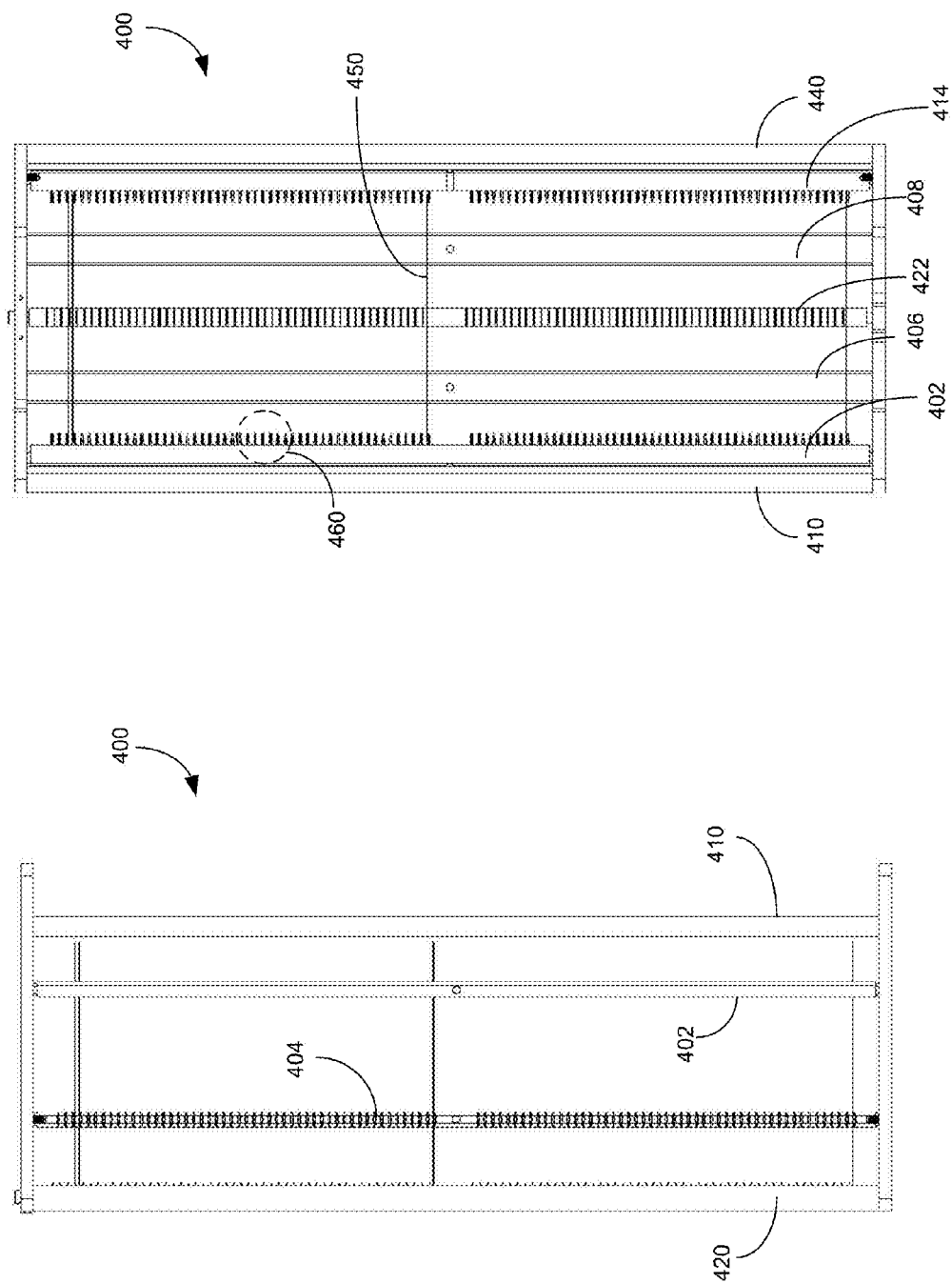

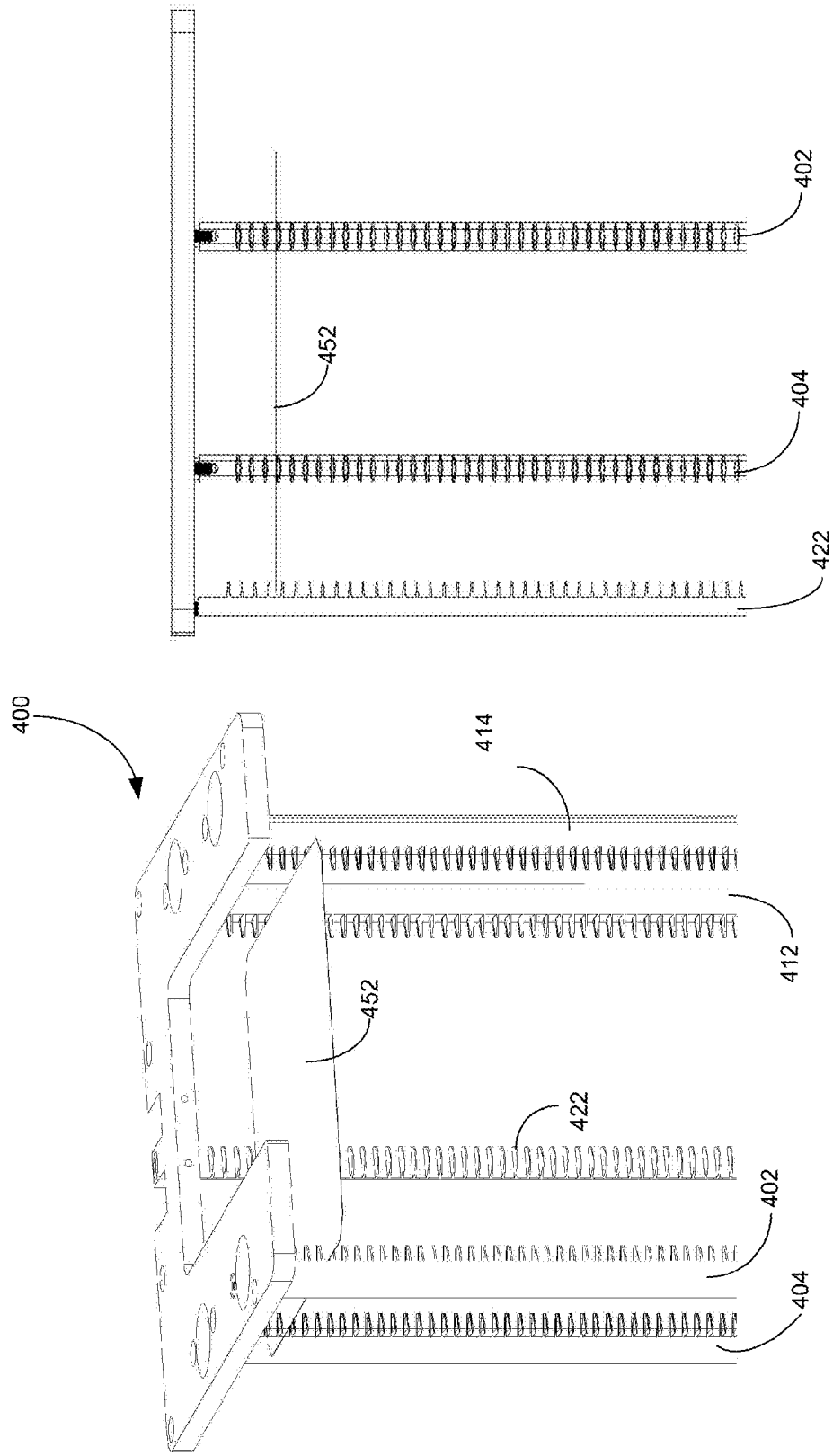

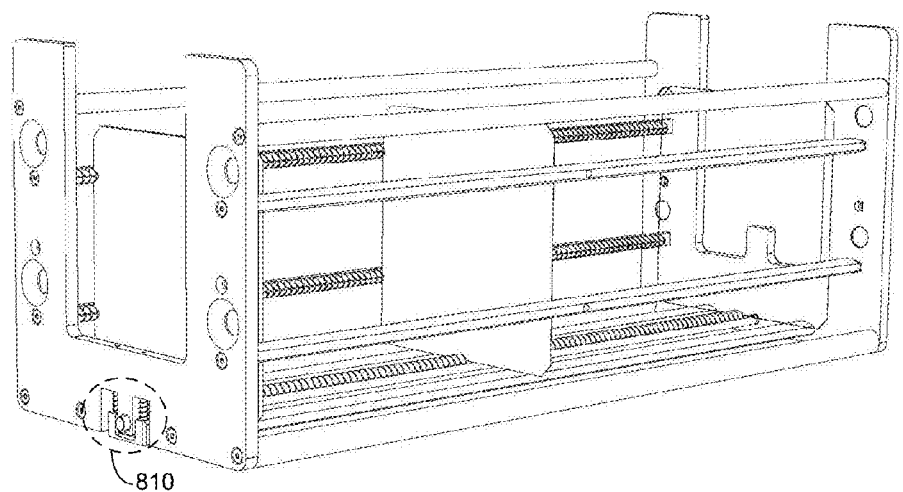
FIG. 8A
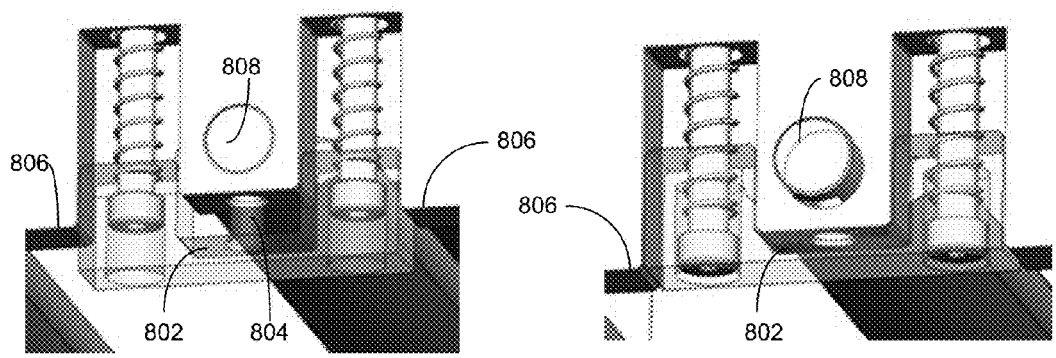
FIG. 8B
FIG. 8C

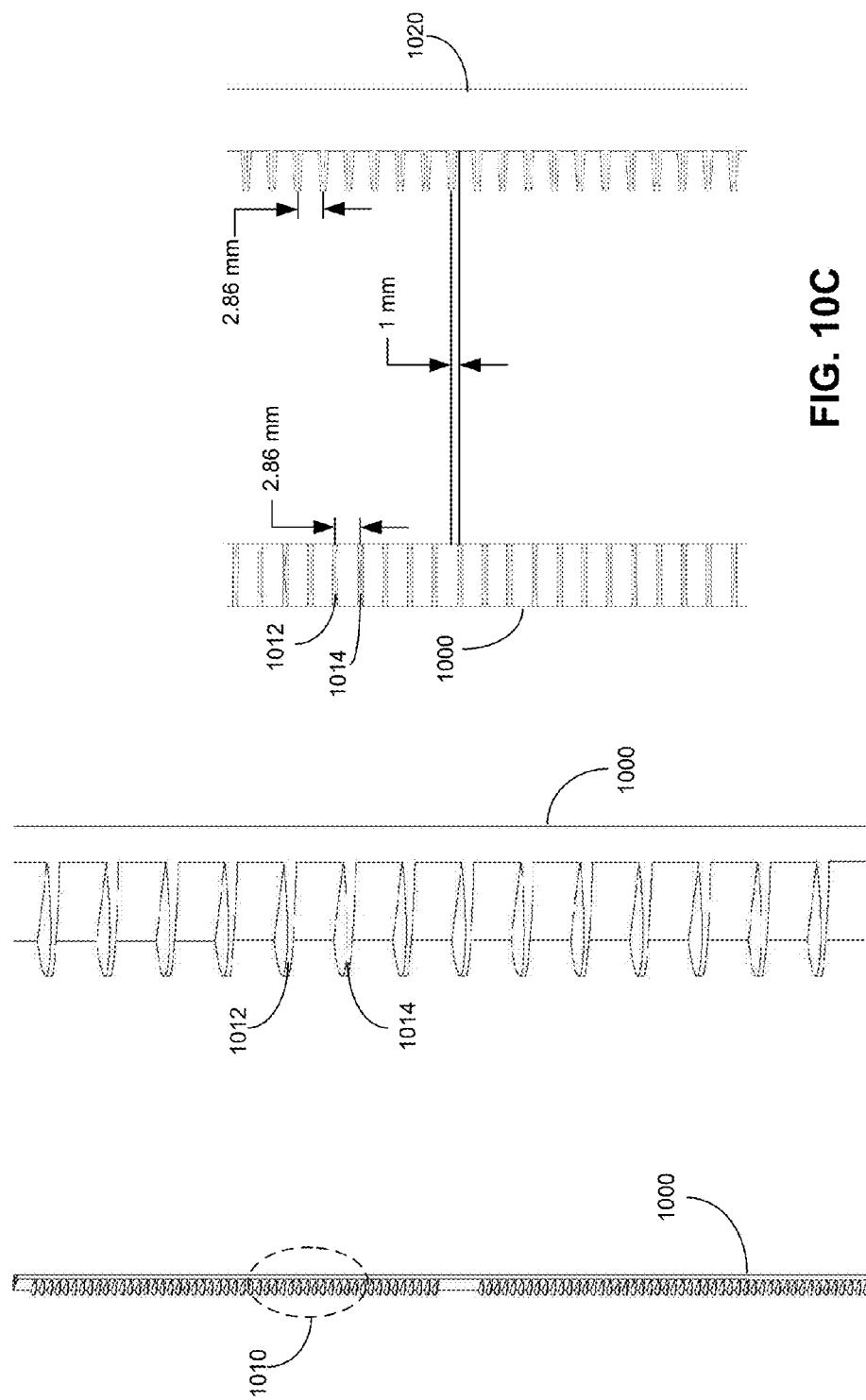

CASSETTE OPTIMIZED FOR AN INLINE ANNEALING SYSTEM

FIELD OF THE INVENTION

This generally relates to the fabrication of photovoltaic structures. More specifically, this disclosure is related to a system and method for securely carrying a large number of wafers in an inline annealing system.

Definitions

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

BACKGROUND

Advances in photovoltaic technology, which is used to make solar panels, have helped solar energy gain mass appeal among those wishing to reduce their carbon footprint and decrease their monthly energy costs. However, current solar cell manufacturing facilities are insufficiently equipped and/or not optimized for large-scale production, and cannot meet the demands of the current solar market. Various new tools that can facilitate large-scale production of high-efficiency solar panels are needed.

SUMMARY

One embodiment can provide an apparatus for carrying a plurality of photovoltaic structures. The apparatus can include a pair of end plates, a set of stationary posts coupling together the end plates, and a wafer-locking mechanism that can be engaged when the apparatus changes orientation. At least one stationary post can be shaped like a comb and have a first array of comb teeth for separating the photovoltaic structures. The wafer-locking mechanism can be configured to lock the photovoltaic structures in position, thereby preventing motion-induced damage to the photovoltaic structures.

In a variation of this embodiment, the wafer-locking mechanism can be engaged when the apparatus rotates from a vertical orientation to a horizontal orientation.

In a variation of this embodiment, the wafer-locking mechanism can include a movable position-locking post positioned between the end plates. The position-locking post can have a second array of comb teeth, and the second array of comb teeth and the first array of comb teeth have substantially similar pitches.

In a further variation, the movable position-locking post can be configured to move from an unlocked position to a locked position in response to the wafer-locking mechanism being engaged.

In a further variation, the second array of comb teeth and the first array of comb teeth can have a predetermined offset when the movable position-locking post is set to the unlocked position, and the offset can be reduced when the movable position-locking post is moved to the locked position.

In a further variation, the apparatus can further include a piston coupled to the movable position-locking post and a push block coupled to the piston. The piston can be configured to convert a first force applied to the push block to a second perpendicular force applied to the movable position-locking post, thereby allowing the movable position-locking post to be moved by moving the push block.

In a further variation, the movable position-locking post can be moved to the locked position when the push block is edge-aligned to an end plate.

In a further variation, the push block can be aligned to an edge of the end plate when the apparatus is placed on a flat surface with the edge of the end plate pressed against the flat surface by the apparatus's weight In a further variation, the push block can extend beyond the edge of an end plate when the movable position-locking post is moved to the unlocked position.

In a variation of this embodiment, the first array of comb teeth can be tapered such that a respective tooth has a streamlined shape.

BRIEF DESCRIPTION OF THE FIGURES

FIG. 4B shows the side view of the wafer cassette, according to one embodiment.

FIG. 4C shows the front view of the wafer cassette, according to one embodiment.

FIG. 4D shows a wafer being supported by the teeth of side wafer-supporting posts, according to one embodiment.

FIG. 4E shows the side view of FIG. 4D, according to one embodiment.

FIG. 8A shows a horizontally oriented wafer cassette, according to one embodiment.

FIG. 8B shows the amplified view of the end pin and the push block with the push block extending beyond the edge of the end plate, according to one embodiment.

FIG. 8C shows the amplified view of the end pin and the push block with the push block aligned to the edge of the end plate, according to one embodiment.

FIG. 10A shows a position-locking post, according to one embodiment.

FIG. 10B shows the amplified view of a section of the position-locking post, according to one embodiment.

FIG. 10C shows a position-locking post along with a side wafer-supporting post, with the position-locking post in the unlocked position, according to one embodiment.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention can provide a wafer-carrying apparatus (e.g., a wafer-carrying cassette) that is designed for transferring photovoltaic structures to an annealing station and carrying the photovoltaic structures during annealing. Because the annealing chamber typically can have a strong flow of purging gases, which is essential for preventing oxidation of metallic grids on surfaces of the photovoltaic structures, photovoltaic structures in the wafer-carrying cassette may vibrate, rattling against the cassette walls or each other. Such rattling can damage the photovoltaic structures. To prevent the photovoltaic structures from excessive vibration when being exposed to the strong air flows inside the annealing chamber, the wafer-carrying cassette can include a wafer-locking mechanism that can lock the wafers in position when activated. In some embodiments, the wafer-locking mechanism can be activated by changing the orientation of the cassette. The cassette can also include additional features that can maximize air flow over surfaces of the photovoltaic structures to prevent oxidation of metallic layers on the wafers.

Photovoltaic Structures with Electroplated Metallic Grids

Electroplated metallic electrode grids (e.g., electroplated Cu grids) have been shown to exhibit lower resistance than conventional aluminum or screen-printed-silver-paste electrodes. Such low electrical resistance can be essential in achieving high-efficiency photovoltaic structures. In addition, electroplated copper electrodes can also tolerate microcracks better, which may occur during a subsequent cleaving process. Such microcracks might impair silver-paste-electrode cells. Plated-copper electrodes, on the other hand, can preserve the conductivity across the cell surface even if there are microcracks. The copper electrode's higher tolerance for microcracks allows the use of thinner silicon wafers, which can reduce the overall fabrication cost. More details on using copper plating to form low-resistance electrodes on a photovoltaic structure are provided in U.S. patent application Ser. No. 13/220,532, entitled "SOLAR CELL WITH ELECTROPLATED GRID," filed on Aug. 29, 2011, the disclosure of which is incorporated herein by reference in its entirety.

Figure 1:
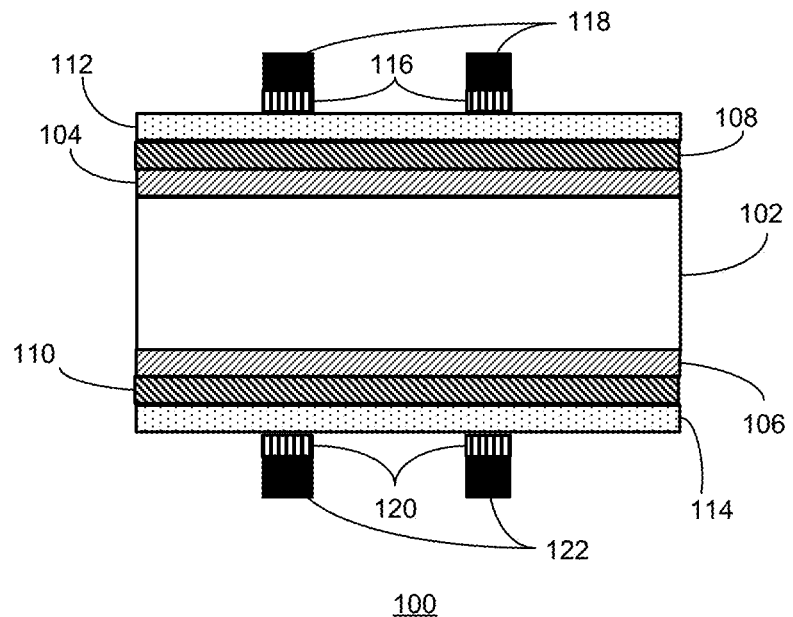
FIG. 1 shows an exemplary photovoltaic structure, according to one embodiment.

FIG. 1 shows an exemplary photovoltaic structure, according to one embodiment. In FIG. 1, photovoltaic structure 100 can include base layer 102, front and back quantum tunneling barrier (QTB) layers 104 and 106, emitter layer 108, surface-field layer 110, front and back TCO layers 112 and 114, a front electrode grid that can include Cu seed layer 116 and electroplated bulk Cu layer 118, and a back electrode grid that can include Cu seed layer 120 and electroplated bulk Cu layer 122.

Base layer 102 can include various materials, such as undoped or lightly doped monocrystalline silicon and undoped or lightly doped micro-crystalline silicon. QTB layers 104 and 106 can include various dielectric materials, such as silicon oxide ($SiO_x$), hydrogenated $SiO_x$, silicon nitride ($SiN_x$), hydrogenated $SiN_x$, aluminum oxide ($AlO_x$), silicon oxynitride (SiON), aluminum oxide ($AlO_x$), hydrogenated SiON, and any combination thereof. In addition to dielectric material, the QTB layers may also include intrinsic (e.g., undoped) silicon in various forms, such as single crystalline Si, polycrystalline Si, amorphous Si, and any combination thereof. The QTB layers can be formed using a wet process that may involve wet or steam oxidation. Emitter layer 108 can include heavily doped wide bandgap material, such as amorphous Si (a-Si) or hydrogenated a-Si (a-Si:H). If base layer 102 is lightly doped, emitter layer 108 can have a conductive doping type opposite to that of base layer 102. Surface-field layer 110 can also include heavily doped wide bandgap material, such as a-Si or a-Si:H. The conductive doping type of surface-field layer 110 can be opposite to that of emitter layer 108. In some embodiments, emitter layer 108 and/or surface-field layer 110 can have a graded doping profile, with a lower doping concentration near the base/emitter or base/surface-field layer interface. The formation of emitter layer 108 and/or surface-field layer 110 can involve a chemical-vapor-deposition (CVD) epitaxial process, such as a plasma-enhanced chemical-vapor-deposition (PECVD) process.

Front and back TCO layers 112 and 114 can be formed using materials such as indium-tin-oxide (ITO), aluminum-doped zinc-oxide (ZnO:Al), gallium-doped zinc-oxide (ZnO:Ga), tungsten-doped indium oxide (IWO), Zn—in—Sn—O (ZITO), and their combinations. The TCO layers can be formed using a PVD process. The TCO layers can then be annealed to improve their electro-optical properties (e.g., high transparency over a wide wavelength range and low electrical resistivity). For example, if the TCO layers include ITO, the annealing can reduce its sheet resistance. Typically, the annealing process can include subjecting the photovoltaic structure to an elevated temperature for a period of time. For example, the annealing of an ITO film can involve subjecting the photovoltaic structure to 200° C. for 20 minutes or longer.

As discussed in the aforementioned U.S. patent application Ser. No. 13/220,532, a thin metallic seed layer (e.g., Cu seed layer 116) can be deposited to improve the adhesion between the electroplated Cu grid and the underlying TCO layer using a PVD technique (e.g., sputtering or evaporation), on top of the TCO layer, because high-energy atoms sputtered from the target can adhere well to the TCO layer. This metallic seed layer can then enhance the adhesion between the TCO layer and the subsequently plated Cu grid.

For photovoltaic structures with TCO layers and electroplated metallic grids, the annealing of the TCO and the metallic layers can be performed in a single step. Annealing the electroplated metal layers can increase the reliability and reduce resistivity of the metallic grid. Detailed descriptions of the annealing process can be found in U.S. patent application Ser. No. 14/920,776, entitled "SYSTEM AND METHOD FOR MANUFACTURING PHOTOVOLTAIC STRUCTURES WITH A METAL SEED LAYER," filed on Oct. 22, 2015, the disclosure of which is incorporated herein by reference in its entirety.

Wafer-Carrying Apparatus

Figure 2:
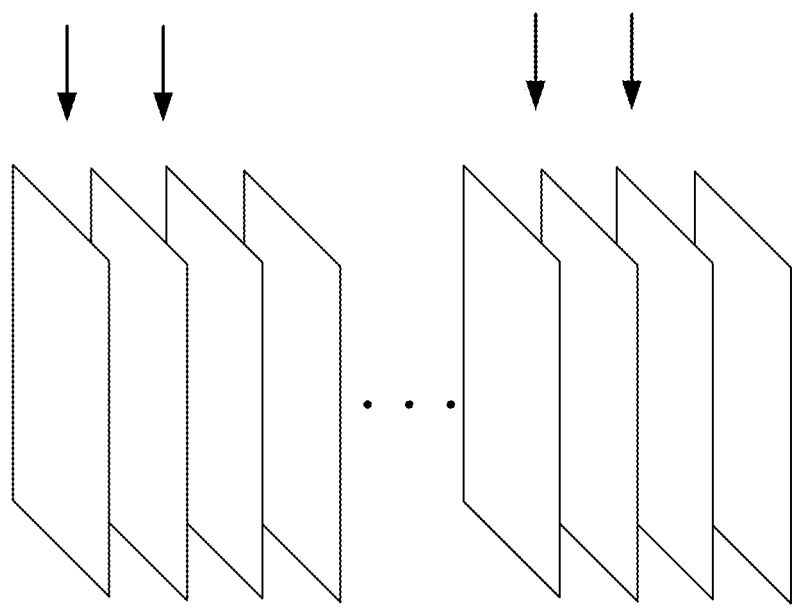
FIG. 2 shows a number of wafers stacked vertically.

To enable large-scale fabrication, it is preferable to perform the annealing in an inline fashion. During annealing, a large number of wafers can move through a high-temperature zone (e.g., inside a convection oven or surrounded by radiators). To accommodate the large number of wafers in the high-temperature zone, one may wish to stack the wafers vertically, as shown in FIG. 2. By vertically orienting the wafers, one can reduce the amount of space required for annealing a large number of photovoltaic structures. In FIG. 2, one can see that the adjacent wafers are separated from each other by a gap, and purging gases can flow between the gaps (as shown by the arrows) at a high rate. The high flow of the purging gases is essential to prevent the metallic grids from oxidation.

Considering that the wafers need to be transported from a previous fabrication station (e.g., a PVD station or an electroplating station), a wafer-carrying apparatus that can carry a large number of stacked wafers can be a desirable tool for carrying the wafers inside the annealing tool. However, many existing wafer-carrying apparatuses, such as wafer-carrying cassettes, are not designed to be used during annealing.

For example, many existing wafer-carrying cassettes are made of chemical resistant plastic (e.g., Teflon) that cannot withstand temperatures (e.g., 200° C. or above). These cassettes cannot be used during annealing. Although there are cassettes that are made of metal that can withstand high temperatures, they are not designed to be used in an environment with a high gas flow rate. This is because wafer-holding slots in most cassettes typically do not have tight grips on the wafers in order to allow for easy loading and unloading, causing wafers carried inside the cassettes to rattle against the cassette walls or rattle against each other under strong flows of gas. Such rattling can damage the metallic grids on the wafer surface or, in worst case, may even break the wafer.

Embodiments of the present invention provide a wafer-carrying apparatus that can carry a large number of wafers and can be used in a thermal annealing environment with high gas flow rates. More specifically, the wafer-carrying apparatus can include a locking mechanism that can be activated to lock the wafers in position to prevent excessive vibrations or abrupt movements of the wafers.

Figure 3:
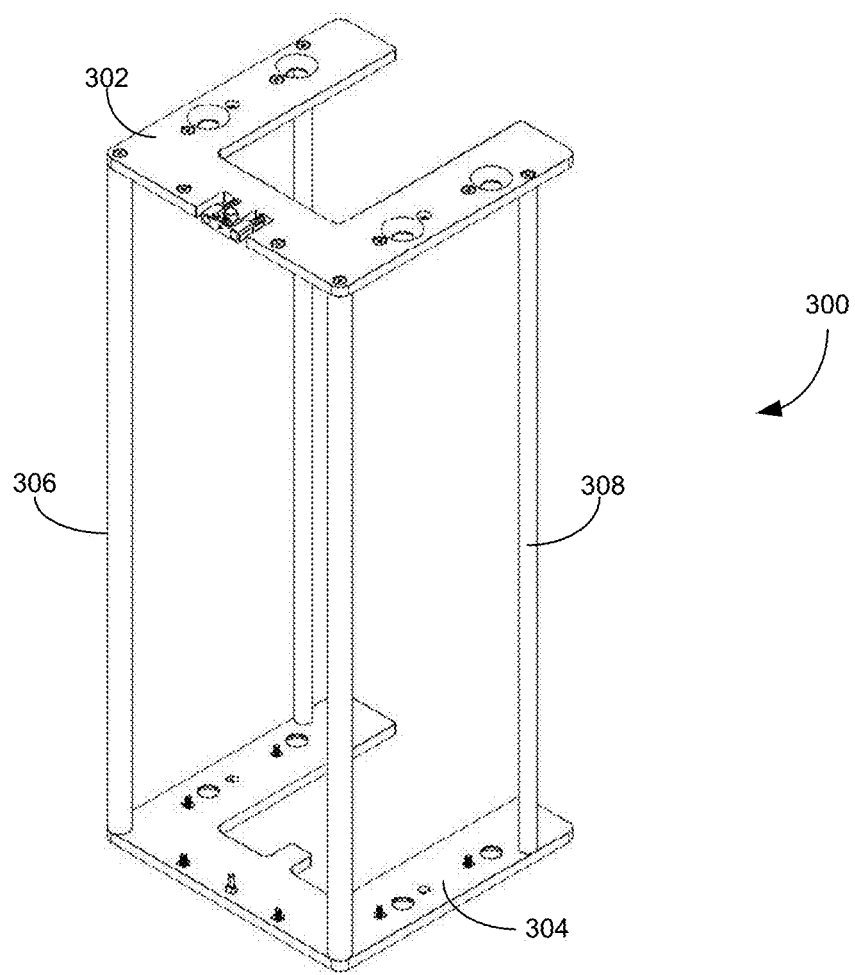
FIG. 3 shows the outer frame of an exemplary wafer cassette, according to one embodiment.

In some embodiments, the wafer-carrying apparatus can be based on a metallic wafer cassette carrier. FIG. 3 shows the outer frame of an exemplary wafer cassette, according to one embodiment. Wafer cassette 300 includes two endplates (e.g., endplates 302 and 304) and four frame posts (e.g., posts 306 and 308) positioned between the two endplates. The frame posts and endplates form a substantially cage-like structure in the shape of a rectangular prism, with the endplates being two opposite faces and the four frame posts forming edges between the opposite faces. These frame posts provide structural support to the end plates. The endplates and the frame posts together form a physical enclosure for the wafers. However, the endplates and the frame posts do not directly contact the wafers and, hence, do not define the positions of the wafers. Instead, a number of wafer-supporting posts, also positioned between the two endplates, can be configured to support and position the wafers.

Figure 4A:
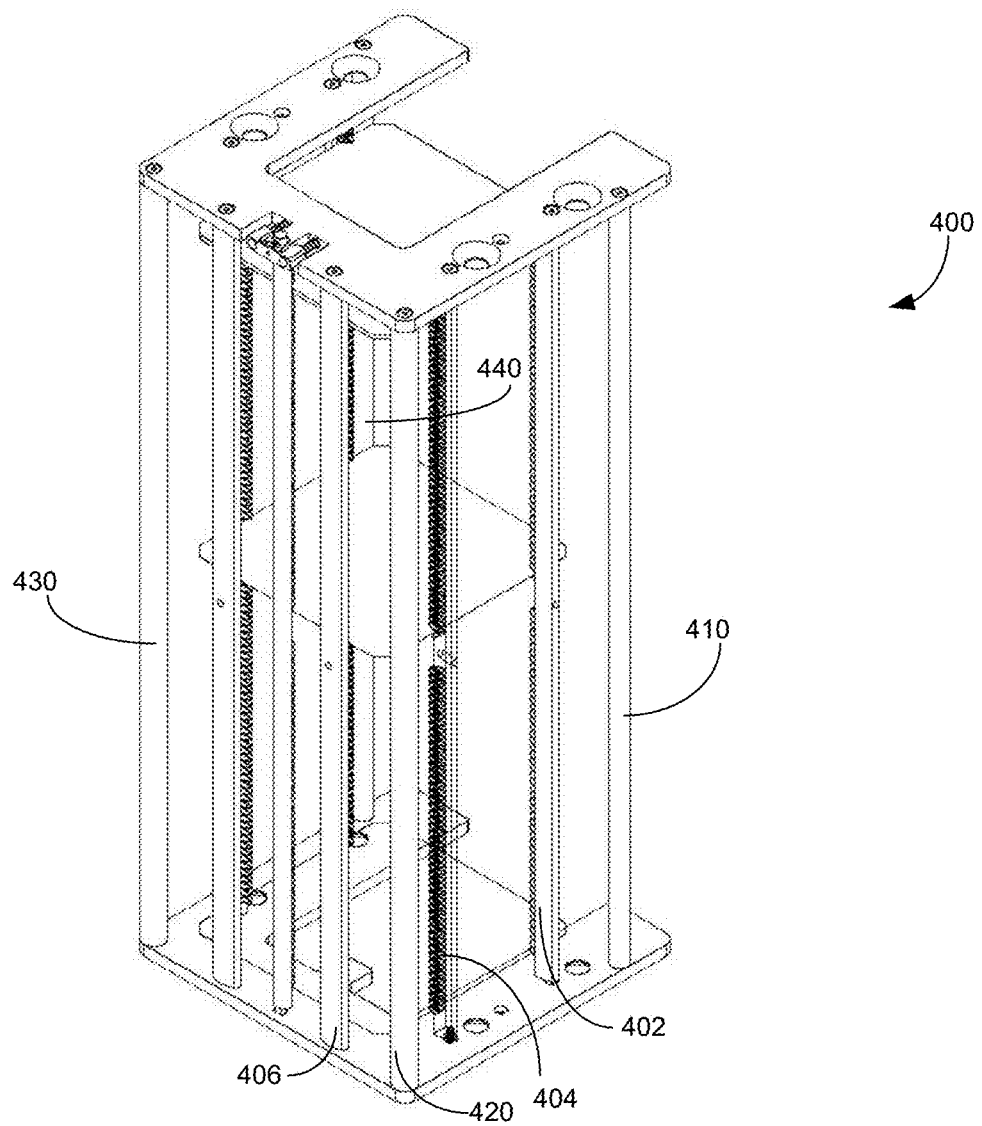
FIG. 4A shows, in perspective view, the exemplary structure of a wafer cassette, according to one embodiment.

FIG. 4A shows the exemplary structure of a wafer cassette, according to one embodiment. In addition to the endplates and the frame posts (e.g., posts 410, 420, 430, and 440), wafer cassette 400 can include a number of wafer-supporting posts, such as posts 402, 404, and 406. More specifically, the wafer-supporting posts can be divided into three sets, with each set of wafer-supporting posts on a side of the wafer cassette between adjacent frame posts, with the exception of the front side. Here, the front side of wafer cassette 400 refers to the side from which the wafers are loaded into and unloaded from wafer cassette 400; hence, there is no post on the front side.

For clearer views, FIGS. 4B and 4C show the side and front views of wafer cassette 400, respectively, according to one embodiment. Particular components of wafer cassette 400 (e.g., posts) can be shown in the different views of wafer cassette 400. For simplicity, same figure elements shown in the different views are referred to using the same reference number. The side view of wafer cassette 400 (FIG. 4B) shows that two side wafer-supporting posts (e.g., posts 402 and 404) are positioned between adjacent frame posts 410 and 420. The opposite side of wafer cassette 400 can be similar, with two side wafer-supporting posts positioned between frame posts positioned on that side. The front view of wafer cassette 400 (FIG. 4C) shows that the side wafer-supporting posts (e.g., posts 402 and 414) do not align to frame post pairs on each side (e.g., post pair 410 and 420 and post pair 430 and 440). Instead, the side wafer-supporting/positioned posts are located closer to the center of wafer cassette 400, making contact with and supporting wafers (e.g., wafer 450 shown in FIG. 4C). Note that, for better viewing, the surface of side wafer-supporting post 404 is made transparent to reveal the cassette teeth.

FIG. 4C also shows that two back wafer-supporting posts (e.g., posts 406 and 408) are positioned between adjacent frame posts 420 and 430 (posts 420 and 430 blocked in view by posts 410 and 440, respectively). In addition, a position-locking post 422 is positioned between back wafer-supporting posts 406 and 408. From FIGS. 4B and 4C, one can see that back wafer-supporting posts 406 and 408 and position-locking post 422 are substantially aligned to frame posts 420 and 430.

FIGS. 4A-4C also show that side wafer-supporting posts (e.g., posts 402, 404, and 414) can include cassette teeth, indicated by short parallel line segments, such as the ones encompassed by circle 460. More specifically, the side wafer-supporting posts can shape like a comb having an array of comb teeth directed inwardly to the center of wafer cassette 400. In addition, position-locking post 422 can also have cassette teeth. On the other hand, back wafer-supporting posts (posts 406 and 408) may not have cassette teeth.

When wafer cassette 400 is oriented vertically, as seen in FIGS. 4A-4C, a wafer (e.g., wafer 450) can be supported by cassette teeth of the side wafer-supporting posts and the position-locking post. More specifically, in the vertical configuration, the corresponding teeth of the different posts, including the side posts and the position-locking post, can be substantially aligned to the same horizontal plane to provide upward support to the wafer. Alternatively, the corresponding teeth of all side wafer-supporting posts can be substantially aligned to the same horizontal plane, whereas the set of teeth on position-locking post 422 can be offset by a small distance (e.g., 1 mm) from the set of teeth on a side wafer-supporting post. This way, the teeth on position-locking post 422 do not actually contact a wafer when the wafer is loaded into the wafer cassette. FIG. 4D shows a wafer being supported by the teeth of side wafer-supporting posts, according to one embodiment. Note that, for better viewing, the frame posts and the back wafer-supporting posts are made transparent. In FIG. 4D, a wafer 452 is placed horizontally in wafer cassette 400, resting on the cassette teeth of posts 402, 404, 412, and 414. FIG. 4E shows the side view of FIG. 4D. In this configuration, wafers can be loaded into wafer cassette 400 from the front side, and the collection of cassette teeth can define multiple horizontal planes, each for an individual wafer, to prevent the wafers from contacting each other. FIG. 4E can also show that wafer 452 is resting on the teeth of side wafer-supporting posts 402 and 404, and is positioned between two adjacent teeth on position-locking post 422 without contacting those two teeth. FIG. 4E can also show that the pitch of the teeth on position-locking post 422 can be similar to that of the side wafer-supporting posts.

In some embodiments, the wafer cassette is oriented vertically during the loading and unloading of the wafers. A robotic arm can pick up a wafer (e.g., by using vacuum suction cups) and place it in the wafer cassette. As one can see from FIG. 4D, the partial openings of the top end plate can allow the robotic arm to stack the wafers from the bottom up. Because loading and unloading can typically occur in a place absent strong air flows, gravity can ensure that the wafers are resting against the cassette teeth with a low likelihood of position changes. However, when the wafer cassette is oriented horizontally, gravity can no longer hold the wafer against the cassette teeth, and strong air flows can cause the wafers to shift positions between adjacent sets of teeth.

In some embodiments, after loading the wafers into a wafer cassette, the wafer cassette can be transferred (either manually or by a robotic arm) to a processing station while remaining vertically orientated. Keeping the wafer cassette in a vertical orientation during transportation can reduce the possibility of wafer shifting. The processing station can process the wafers in an inline fashion with the wafers maintained inside the wafer cassette and the wafer cassette rotating to a horizontal orientation. To prevent the wafers from shifting position, in some embodiments, the position-locking post can be configured to lock the position of the wafers in the wafer cassette after the wafer cassette rotates to the horizontal orientation. More specifically, the position-locking post can shift its position to make contact with the wafers in order to lock the wafers in position.

Figure 5A:
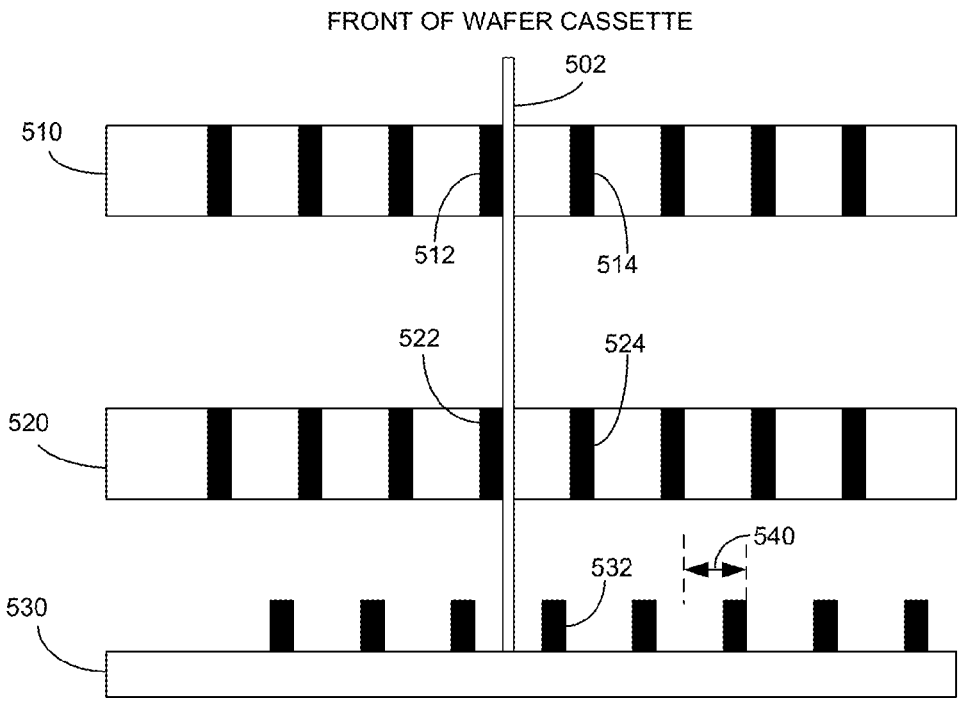
FIG. 5A illustrates the position of the wafer and the position-locking post before locking, according to one embodiment.

FIG. 5A illustrates the position of the wafer and the position-locking post before locking, according to one embodiment. After the wafer cassette is rotated to the horizontal orientation, the previously vertically oriented posts, including the side wafer-supporting posts and the position-locking post, are now oriented horizontally. Each of side wafer-supporting posts 510 and 520 has a set of teeth, and corresponding teeth of these two posts can be substantially aligned. For example, teeth 512 and 514 of post 510 can be aligned with teeth 522 and 524, respectively, of post 520. On the other hand, teeth on position-locking post 530 can be misaligned with the teeth on the side wafer-supporting post by a small offset (e.g., offset 540). For example, tooth 532 can be misaligned with teeth 512 and 522.

After the cassette is rotated, a previously loaded wafer can be positioned between cassette teeth of side wafer-supporting posts 510 and 520. For example, wafer 502 can be positioned between teeth 512 and 514 of post 510 and between teeth 522 and 524 of post 520. Note that the distance between the teeth (e.g., between teeth 512 and 514) can be larger compared to the thickness of wafer 502. This is an intentional design to allow for easy loading and unloading of wafer 502. However, this also means that wafer 502 can move freely between the teeth. In an environment with strong air flow, wafer 502 may have sudden or rapid movements against the cassette teeth and can be damaged. To prevent such motion-induce damage to the wafers, it is desirable to have a position-locking mechanism that can lock the wafers in position.

Figure 5B:
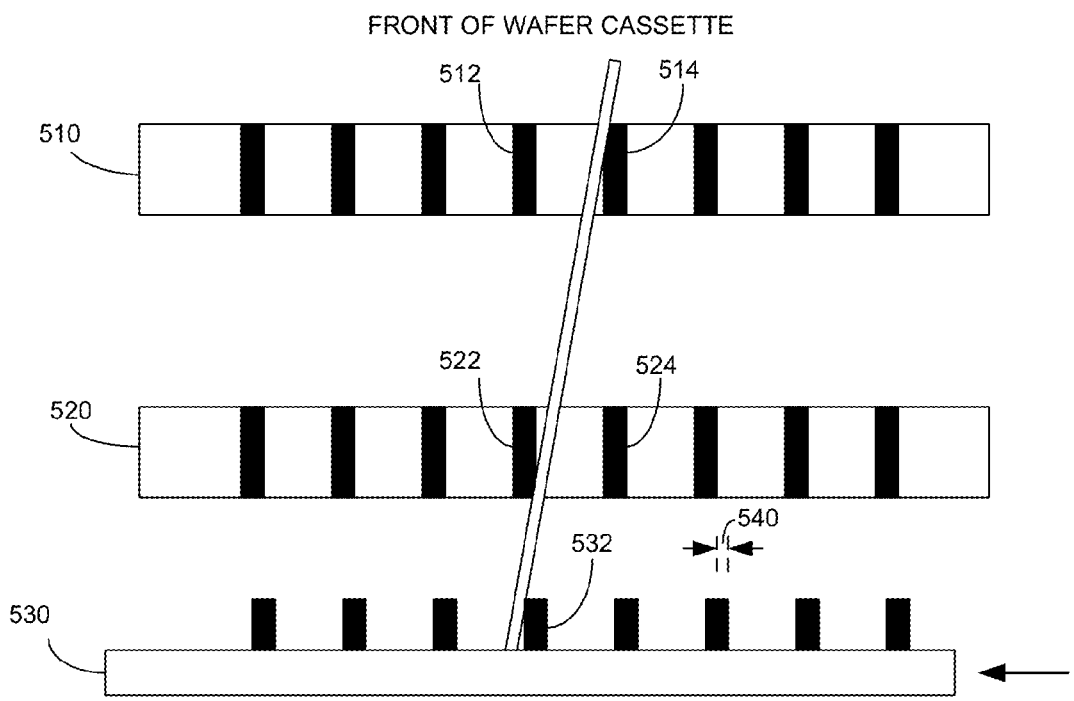
FIG. 5B illustrates the position of the wafer and the position-locking post after locking, according to one embodiment.

FIG. 5B illustrates the position of the wafer and the position-locking post after locking, according to one embodiment. Unlike the side wafer-supporting posts that are stationary, position-locking post 530 can be movable. The locking of the wafer can take place when position-locking post 530 moves to a position such that cassette teeth on position-locking post 530 can be substantially aligned to the teeth on side wafer-supporting posts 510 and 520. In the example shown in FIG. 5B, position-locking post 530 can move to the left (as indicated by the arrow) such that tooth 532 can be substantially aligned to teeth 512 and 522, and the amount of offset (e.g., offset 540) can be significantly reduced. This way, wafer 502 can simultaneously come into contact with teeth 514, 522, and 532. The three contact points can define a plane, to which the position of wafer 502 is restrained.

One can see from FIGS. 5A-5B that the wafers in the cassette can be locked into position by moving the movable position-locking post from an unlocked position (where its teeth are misaligned with teeth of the wafer-supporting posts) to a locked position (where its teeth can be substantially aligned to those of the side wafer-supporting posts). Although the position-locking post can be moved manually, manual control can be less accurate and can be prone to human errors.

In some embodiments, the wafer cassette can include an automatic wafer-position-locking module that can be automatically engaged when the wafer cassette changes its orientation. For example, when the wafer cassette rotates from the vertical to the horizontal orientation, the automatic position-locking module can be engaged to lock the positions of the wafers such that the wafers can remain substantially stationary even under strong air flows. The automatic position-locking module can include a position-locking post and a spring-loaded post-pushing mechanism. The position-locking post can have two positions, a locked position and an unlocked position. The automatic position-locking module can be engaged when the post-pushing mechanism pushes the position-locking post from the unlocked position to the locked position. The post-pushing mechanism can be configured to automatically push the position-locking post to the locked position when the wafer cassette changes its orientation.

In some embodiments, when the wafer cassette is vertically oriented, gravity can keep the position-locking post in the unlocked position such that the teeth on the position-locking post remain misaligned to other cassette teeth and do not come into contact with the wafers. FIG. 6A shows the wafer cassette vertically oriented with the position-locking post in the unlocked position, according to one embodiment. Position-locking post 602 is positioned between top end plate 610 and bottom end plate 620. When wafer cassette 600 is vertically oriented, position-locking post 602 is pulled down by gravity to rest naturally on end plate 620.

Figure 6B:
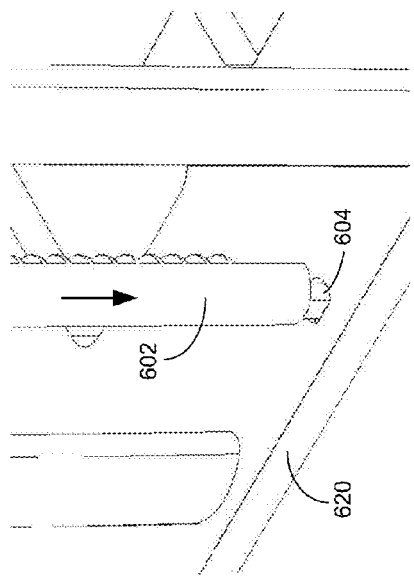
FIG. 6B shows the amplified view of the bottom of the position-locking post before the position-locking post is completely pulled down, according to one embodiment.

FIG. 6B shows the amplified view of the bottom of the position-locking post before the position-locking post is completely pulled down, according to one embodiment. More specifically, FIG. 6B shows the amplified view of region 630 before position-locking post 602 is pulled down completely. The amplified view shows that the bottom of position-locking post 602 can be coupled to an end peg 604, whose diameter is smaller than that of position-locking post 602. End peg 604 can fit into an opening on end plate 620 and can move vertically in the opening. When position-locking post 602 is vertically oriented, gravity pulls down end peg 604 along with position-locking post 602 (as indicated by the downward arrow) until end peg 604 completely enters the opening and position-locking post 602 comes into contact with and is supported by end plate 620.

Figure 6C:
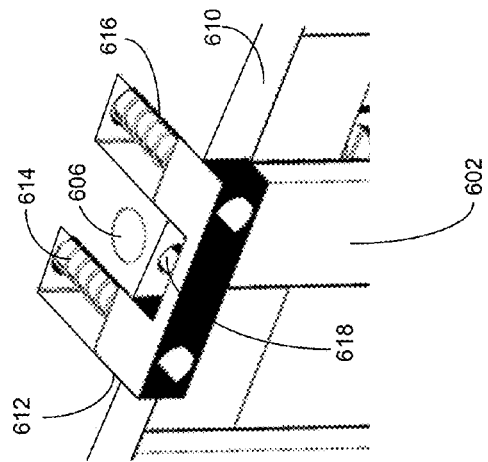
FIG. 6C shows the top of the position-locking post after the position-locking post is completely pulled down, according to one embodiment.
Figure 6A:
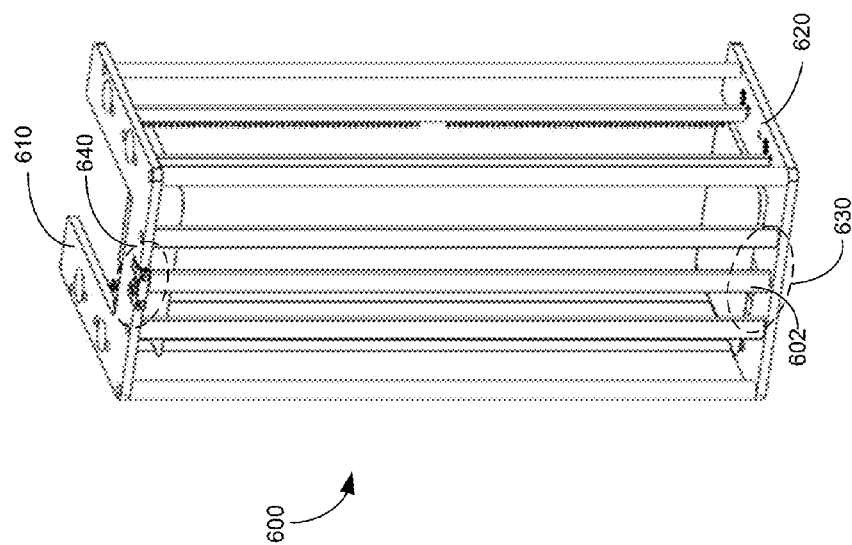
FIG. 6A shows the wafer cassette vertically oriented with the position-locking post in the unlocked position, according to one embodiment.

FIG. 6C shows the top of the position-locking post after the position-locking post is completely pulled down, according to one embodiment. More specifically, FIG. 6C shows the amplified view of region 640 after position-locking post 602 is pulled down completely. The amplified view shows that the top of position-locking post 602 can be coupled to piston 606, which can fit into an opening in top end plate 610. When position-locking post 602 is pulled downward by gravity, it pulls down piston 606, which can convert the vertical pulling force to a lateral pushing force to push out, with the assistance of a pair of springs 614 and 616 and an end pin 618, push block 612, causing push block 612 to extend beyond the edge of top end plate 610.

Figure 7B:
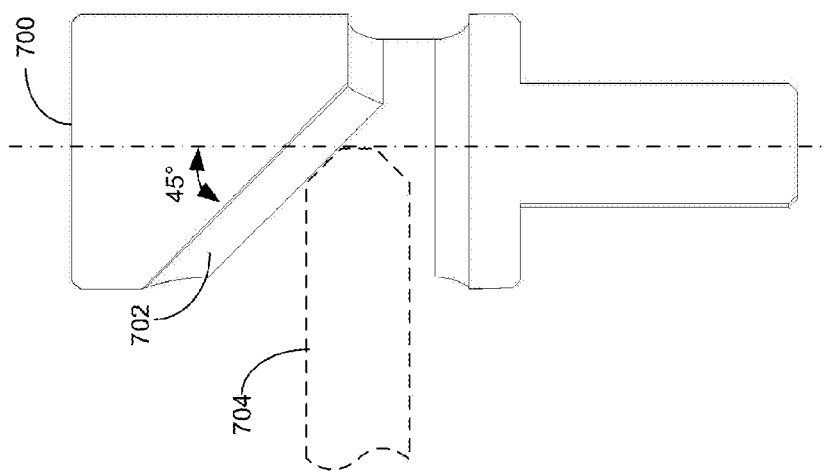
FIG. 7B shows the cross-sectional view of the piston along cut plane A-A', according to one embodiment.
Figure 7A:
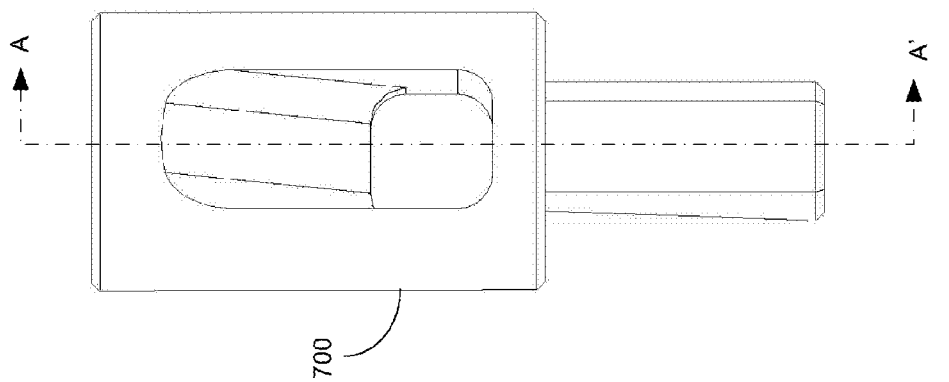
FIG. 7A shows the front view of the piston, according to one embodiment.
Figure 7C:
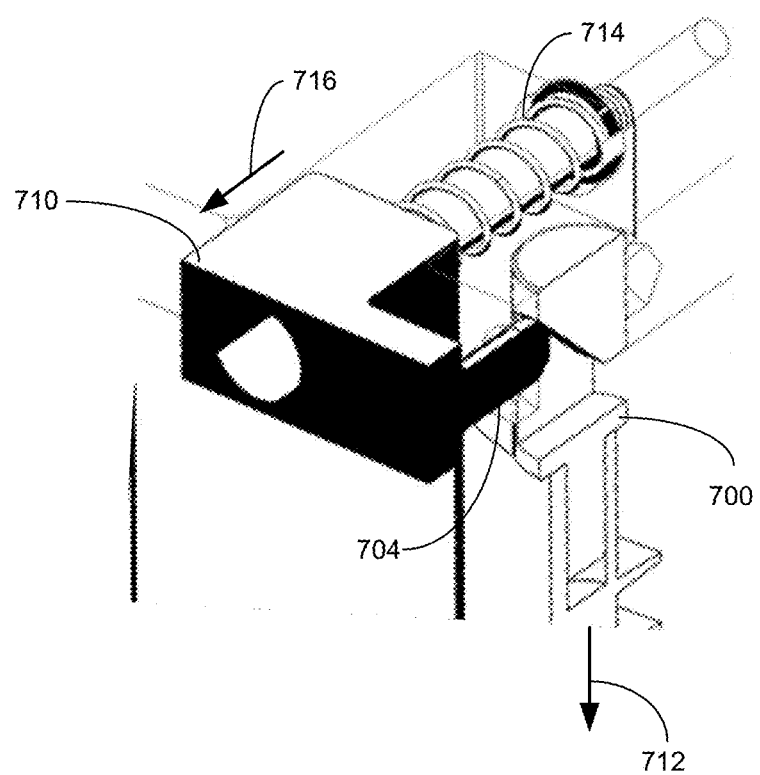
FIG. 7C shows a downwardly moving piston pushing out the push block, according to one embodiment.

To better understand the operation of piston 606, FIG. 7A shows the front view of the piston and FIG. 7B shows the cross-sectional view of the piston along cut plane A-A', according to one embodiment. Combining FIGS. 7A and 7B, one can see that the top portion of piston 700 can be hollow to allow end pin 704 to couple to piston 700 by entering its hollow center. The solid bottom portion of piston 700 can couple piston 700 to the position-locking post. The hollow center of piston 700 can include a slanted surface 702, which can facilitate piston 700 to convert a vertical motion of piston 700 to a horizontal motion of end pin 704. Note that end pin 704 can also have a slanted surface to interface with surface 702. In some embodiments, the angle between slanted surface 702 and the longitude axis of piston 700 can be roughly 45°. FIG. 7C shows a downwardly moving piston pushing out the push block, according to one embodiment. When piston 700 moves downward, as indicated by arrow 712, its sloped center core can push end pin 704 in a horizontal direction. The horizontal movement of end pin 704 and the decompressing of spring 714 can together move push block 710 in a horizontal direction, as indicated by arrow 716. In some embodiments, end pin 704 can be part of push block 710.

In some embodiments, piston 700 and end pin 704 can both be made of anodized aluminum to reduce the amount of friction between slanted surface 702 and end pin 704. Alternatively, they can be made of other types of metallic materials, such as stainless steel and aluminum.

On the other hand, when the wafer cassette is rotated to a horizontal orientation and is placed on a flat surface, which is the case when it is placed into an annealing oven, the aforementioned operation of the piston can be reversed. More specifically, the push block that was extended beyond the edge of the end plate can be pushed back by the flat surface to be aligned with the edge of the end plate. The movement of the push block can, in turn, move the piston in a perpendicular direction and, hence, also move the position-locking post to the locked position.

FIG. 8A shows a horizontally oriented wafer cassette, according to one embodiment. FIG. 8B shows the amplified view of the end pin and the push block with the push block extending beyond the edge of the end plate, according to one embodiment. FIG. 8C shows the amplified view of the end pin and the push block with the push block aligned to the edge of the end plate, according to one embodiment. More specifically, FIGS. 8B and 8C show the amplified view of region 810.

In FIG. 8B, push block 802 is pushed by end pin 804 such that its edge extends beyond end plate edge 806. In this scenario, the end of piston 808 can be aligned to the surface of the end plate. In FIG. 8C, the outer edge of push block 802 is aligned to end plate edge 806, pushing the end pin (view blocked in FIG. 8C) upwardly into the hollow core of piston 808. The upward motion of the end pin can lead to a horizontal motion of piston 808, resulting in the end of piston 808 extruding out the surface of the end plate, as shown in FIGS. 8A and 8C. Because piston 808 is coupled to the position-locking post, the horizontal movement of piston 808 can, in turn, move the position-locking post to the locked position, constraining any movement of the wafers in the cassette.

Because the push block can be pushed into the edge-aligned position by simply placing the wafer cassette on a flat surface, there is no additional manual operation required to engage the position-locking mechanism (i.e., to move the position-locking post to the locked position). By carefully designing the size and shape of the end pin and piston, one can accurately control the movement of the position-locking post, such that the position-locking post can lock the wafers in position without damaging the wafers. Note that the shape of the push block is not limited to the one shown in FIGS. 8A-8C. Other shapes are also possible, as long as the push block can be moved by the rotation of orientation of the wafer cassette.

Figure 9C:
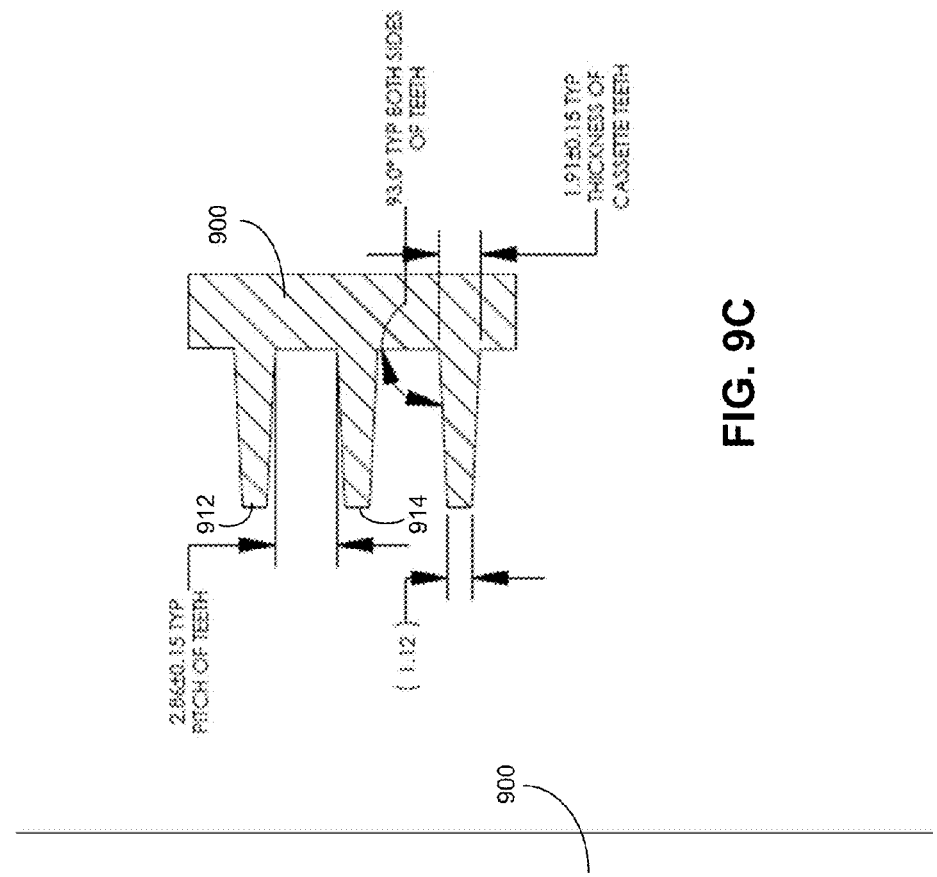
FIG. 9C shows a detailed view of a number of cassette teeth, according to one embodiment.
Figure 9B:
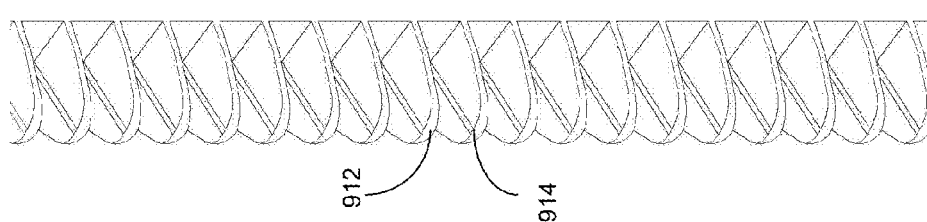
FIG. 9B shows the amplified view of a section of the side wafer-supporting post, according to one embodiment.
Figure 9A:
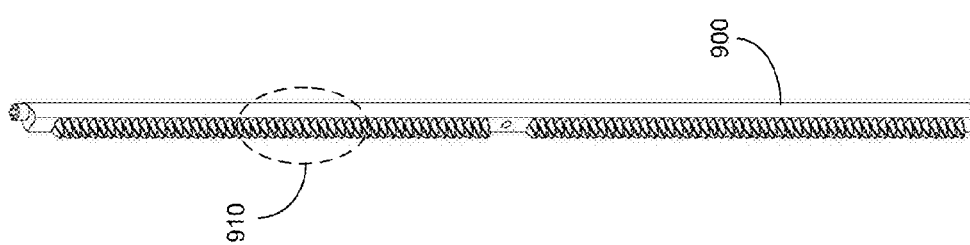
FIG. 9A shows a side wafer-supporting post, according to one embodiment.

FIG. 9A shows a side wafer-supporting post, according to one embodiment. Side wafer-supporting post 900 is coupled to the end plates and when the wafer cassette switches orientation, side wafer-supporting post 900 remains stationary relative to the end plates and the frame posts. FIG. 9B shows the amplified view of a section of the side wafer-supporting post, according to one embodiment. More specifically, FIG. 9B shows the amplified view of region 910. Side wafer-supporting post 900 can include a set of parallel, evenly spaced teeth (e.g., teeth 912 and 914) for separating and confining wafers. In some embodiments, side wafer-supporting post 900 can have 51 cassette teeth in total.

FIG. 9C shows a detailed view of a number of cassette teeth, according to one embodiment. In the drawing, the length unit is mm. In the example shown in FIG. 9C, the pitch of the cassette teeth (e.g., the distance between teeth 912 and 914) can be roughly 2.86 mm, and the height of each tooth can be roughly 7.5 mm. Other dimensions are also possible. For example, the pitch can be any number between 2 and 5 mm, and the tooth height can be between 5 and 10 mm. The relatively wider pitch (compared to the wafer thickness) can allow for easy loading and unloading of the wafers. In addition, each tooth is tapered on both sides to have a streamlined shape. The streamlined shape of the teeth makes it possible for purging gas to flow around the post, thus increasing the amount of flow between teeth. This is important, because the flow of the purging gas can prevent oxidation of the metallic grids on the wafers.

FIG. 10A shows a position-locking post, according to one embodiment. Position-locking post 1000 is coupled to the end plates and when the wafer cassette switches orientation, position-locking post 1000 can shift its position with respect to the side wafer-supporting posts. FIG. 10B shows the amplified view of a section of the position-locking post, according to one embodiment. More specifically, FIG. 10B shows the amplified view of region 1010. Position-locking post 1000 can include a set of parallel, evenly spaced teeth (e.g., teeth 1012 and 1014). In some embodiments, the teeth on position-locking post 1000 can have the same number and pitch as that of the teeth of the side wafer-supporting post. For example, the pitch in the example shown in FIG. 10B can be roughly 2.86 mm, and position-locking post 1000 can have a total of 51 teeth. On the other hand, because the teeth of position-locking post 1000 do not serve the purpose of supporting the wafers when the wafer cassette is upright, these teeth can be slightly shorter than the teeth on the side wafer-supporting post.

FIG. 10C shows a position-locking post along with a side wafer-supporting post, with the position-locking post in the unlocked position, according to one embodiment. FIG. 10C shows the front view of position-locking post 1000 and the side view of side wafer-supporting post 1020. The pitch of teeth on position-locking post 1000 can be same as that of teeth on side wafer-supporting post 1020. In addition, there is a small offset (e.g., 1 mm) between the set of teeth on position-locking post 1000 and the set of teeth on side wafer-supporting post 1020. When position-locking post 1000 is moved to the locked position, this offset will be reduced, resulting in wafers being locked in position.

Figure 11:
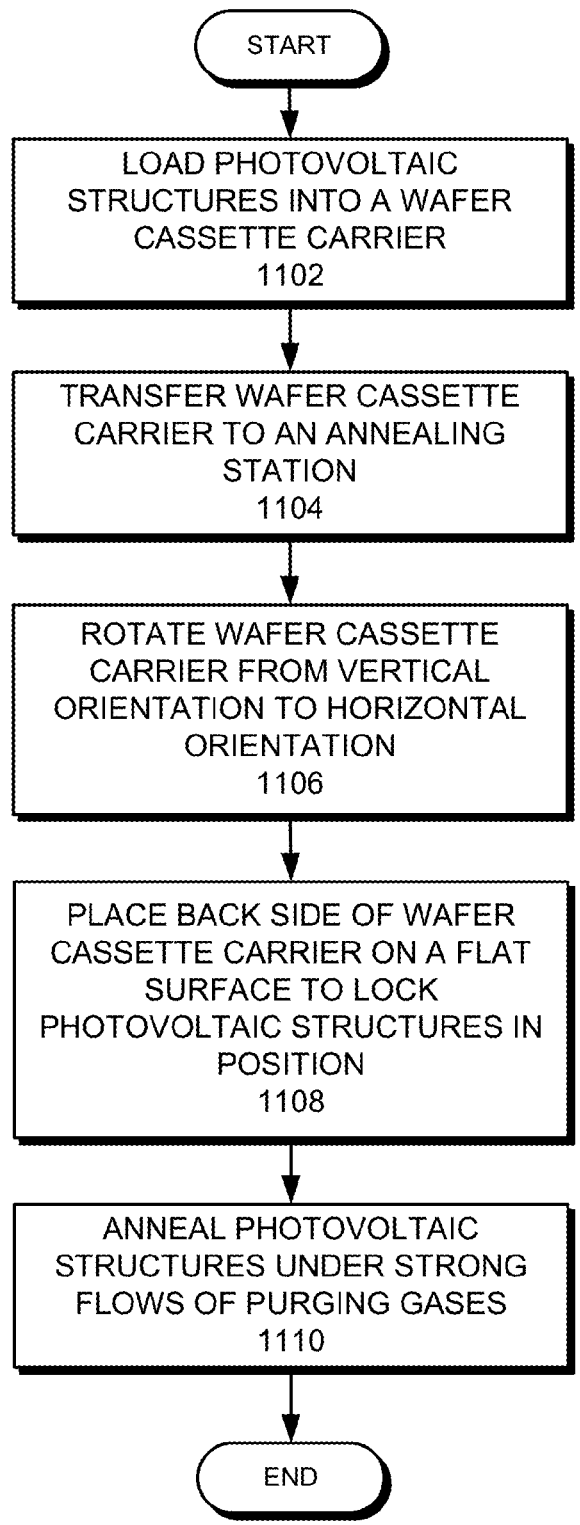
FIG. 11 shows an exemplary fabrication process, according to one embodiment.

FIG. 11 shows an exemplary fabrication process, according to one embodiment. During operation, a number of photovoltaic structures can be loaded into a wafer cassette carrier (operation 1102). The photovoltaic structures can undergo a number of fabrication processes, including but not limited to: wet oxidation, PECVD of a-Si layers, PVD of TCO layers, and metallization. In some embodiments, the wafer cassette can be maintained in a vertical orientation with individual wafers resting on cassette teeth.

Subsequently, the wafer cassette carrier can be transferred to an annealing station (operation 1104). In some embodiments, a human operator can manually carry the wafer cassette carrier to the annealing station. Alternatively, an automated system, such as a conveyor system, can transfer the wafer cassette carrier to the annealing station. At the annealing station, the wafer cassette carrier is rotated from a vertical orientation to a horizontal orientation (operation 1106). Subsequently, the back side of the wafer cassette carrier is placed on a flat surface inside the annealing station, resulting in the photovoltaic structures being locked in position (operation 1108). The back side of the wafer cassette carrier refers to the side opposite to the wafer loading/unloading side. Subsequently, the photovoltaic structures can be annealed under strong flows of purging gases (operation 1110).

In addition to allowing for batch operation in an environment with strong air flows, the wafer carrier cassette can also be used to transfer wafers among processing stations. In particular, if the wafers are transferred automatically inside a wind tunnel coupling two processing stations by a conveyor system, one may also want to lock the wafers in position to prevent vibrations or movement of the wafers.

In general, embodiments of the present invention can provide a novel apparatus for carrying solar cell wafers. More specifically, this novel apparatus can include a wafer position-locking mechanism that can be automatically engaged when the apparatus changes its orientation. Once the wafer position-locking mechanism is engaged, wafers carried inside the apparatus can be locked into position, thus preventing possible damage to the wafers caused by vibrations or movement of the wafers. In the examples shown in FIGS. 1-11, the wafer position-locking mechanism is engaged when the wafer cassette rotates from a vertical orientation to a horizontal orientation. In practice, depending on the need, it is also possible to engage the wafer position-locking mechanism by rotating the wafer cassette from a horizontal orientation to a vertical orientation. This can be easily implemented by adjusting the position of the position-locking post, such that the position-locking post is in the locked position when the wafer cassette is oriented vertically and is in the unlocked position when the wafer cassette is oriented horizontally.

In addition to the post-moving mechanisms shown in FIGS. 6A-8C, other mechanisms that can move the position-locking post can also be used. For example, the position-locking post can also be manually moved, locking the wafers in position without the wafer cassette shifting orientation. Alternatively, the position-locking post can be coupled to an external automated mechanism that can induce motion.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. An apparatus for carrying a plurality of photovoltaic structures, comprising:
   a pair of end plates;
   a set of stationary posts coupling together the end plates, wherein at least one stationary post is shaped like a comb and has a first array of comb teeth for separating the photovoltaic structures; and
   a wafer-locking post comprising a second array of comb teeth, wherein an orientation change of the apparatus automatically shifts the second array of comb teeth resulting an offset between a respective tooth in the second array against a corresponding tooth in the first array, wherein the offset results in a locking-position plane, which is defined by contact points of the teeth of the first and second arrays, being different from an initial loading-position plane, and wherein the locking-position plane restrains movement of the photovoltaic structure.

2. The apparatus of claim 1, wherein the orientation change of the apparatus comprises rotating from a vertical orientation to a horizontal orientation.

3. The apparatus of claim 1, wherein the second array of comb teeth and the first array of comb teeth have substantially similar pitches.

4. The apparatus of claim 1, wherein the wafer-locking post is configured to move from an unlocked position to a locked position in response to the orientation change of the apparatus.

5. The apparatus of claim 1, further comprising a piston coupled to the wafer-locking post and a push block coupled to the piston, wherein the piston is configured to convert a first force applied to the push block to a second perpendicular force applied to the wafer-locking post, thereby allowing the wafer-locking post to be moved by moving the push block.

6. The apparatus of claim 5, wherein the wafer-locking post is set to the locked position when the push block is edge-aligned to an end plate.

7. The apparatus of claim 6, wherein the push block is aligned to an edge of the end plate when the apparatus is placed on a flat surface with the edge of the end plate pressed against the flat surface by the apparatus's weight.

8. The apparatus of claim 5, wherein the push block extends beyond the edge of an end plate when the wafer-locking post is set to the unlocked position.

9. The apparatus of claim 1, wherein the first array of comb teeth are tapered such that a respective tooth has a streamlined shape.

10. A wafer cassette carrier for carrying a plurality of photovoltaic structures, comprising:
    an outer frame, which includes a pair of end plates and a set of frame posts coupling the end plates;
    a set of wafer-supporting posts positioned between the end plates, wherein a respective wafer-supporting post includes a first array of cassette teeth that are substantially aligned to cassette teeth of a separate wafer-supporting post such that a photovoltaic structure loaded into the wafer cassette carrier is confined between adjacent sets of corresponding cassette teeth of the wafer-supporting posts; and
    a position-locking post positioned between the end plates, wherein the position-locking post comprises a second array of cassette teeth, and wherein an orientation change of the wafer cassette automatically shifts the second array of cassette teeth resulting an offset between a respective tooth in the second array against a corresponding tooth in the first array, wherein the offset results in a locking-position plane, which is defined by contact points of the teeth of the first and second arrays, being different from an initial loading-position plane of a respective photovoltaic structure, and wherein the locking-position plane restrains movement of the photovoltaic structure.

11. The wafer cassette carrier of claim 10, wherein the orientation change of the wafer cassette comprises rotating from a vertical orientation to a horizontal orientation.

12. The wafer cassette carrier of claim 10, wherein the position-locking post remains at the unlocked position when the wafer cassette carrier is vertically oriented such that the photovoltaic structure is supported horizontally by the wafer-supporting post.

13. The wafer cassette carrier of claim 10, wherein the second array of cassette teeth has a pitch that is similar to that of the first array of cassette teeth of the wafer-supporting post.

14. The wafer cassette carrier of claim 10, further comprising a piston coupled to the position-locking post and a push block coupled to the piston, wherein the piston is configured to convert a first force applied to the push block to a second perpendicular force applied to the position-locking post, thereby allowing the position-locking post to be moved by moving the push block.

15. The wafer cassette carrier of claim 14, wherein the position-locking post is set to the locked position when the push block is edge-aligned to an end plate.

16. The wafer cassette carrier of claim 14, wherein the push block extends beyond the edge of an end plate when the position-locking post is set to the unlocked position.

17. The wafer cassette carrier of claim 14, wherein the piston and the push block are made of anodized aluminum.

18. The wafer cassette carrier of claim 10, wherein the first array of cassette teeth are tapered such that a respective tooth has a streamlined shape.

* * * * *